United States Patent [19]
Taguchi et al.

[11] Patent Number: 5,770,942
[45] Date of Patent: Jun. 23, 1998

[54] MAGNETIC DETECTOR EMPLOYING MAGNETIC RESISTANCE ELEMENTS FOR DETECTING CHARGES IN A MAGNETIC FIELD

[75] Inventors: Tadashi Taguchi; Teruhiko Ohtaki, both of Nagano, Japan

[73] Assignee: Sankyo Seiki Mfg. Co., Ltd., Nagano-ken, Japan

[21] Appl. No.: 649,277

[22] Filed: May 17, 1996

[30] Foreign Application Priority Data

May 23, 1995 [JP] Japan ................................. 7-123253

[51] Int. Cl.$^6$ .............................. G01B 7/14; G01R 33/06
[52] U.S. Cl. .................. 324/207.21; 324/252; 333/32 R
[58] Field of Search ........................ 324/207.12, 207.21, 324/207.2, 252, 251, 207.25, 207.24, 207.22; 338/32 R, 32 H

[56] References Cited

U.S. PATENT DOCUMENTS

5,047,716  9/1991  Katagirl .
5,243,280  9/1993  Kusumi ............................... 324/207.21
5,453,684  9/1995  Nakayama .......................... 324/207.12

*Primary Examiner*—Walter E. Snow
*Attorney, Agent, or Firm*—McAulay Fisher Nissen Goldberg & Kiel, LLP

[57] ABSTRACT

A magnetic detector comprises a magnetic recording medium in which a magnetic signal of wavelength $\lambda$ generated by two types of opposing magnetic poles which are repeated at constant intervals is recorded and a magnetic resistance element that is arranged opposite to the magnetic recording medium and changes its resistivity value according to the change in a magnetic field. The magnetic resistance element is comprised of first and second current paths constructed of a plurality of magnetic resistance strips. The first current path and the second current path are connected in series with each other. Each magnetic strip of the first current path is arranged parallel to that of the second current path at an interval of $\lambda/4$ to form a plurality of magnetic resistance strip sets. Centers of the magnetic strip sets are spaced by $3n\lambda/4$ from each other, where n is an integer of 1 or greater.

10 Claims, 6 Drawing Sheets

MAGNETIC DETECTOR EMPLOYING MAGNETIC RESISTANCE ELEMENTS FOR DETECTING CHARGES IN A MAGNETIC FIELD

BACKGROUND OF THE INVENTION

1. Field of the Invention

This invention relates to a configuration of a magnetic detector used, for example, for a linear encoder and the like.

2. Background of the Related Art

Figure 5:
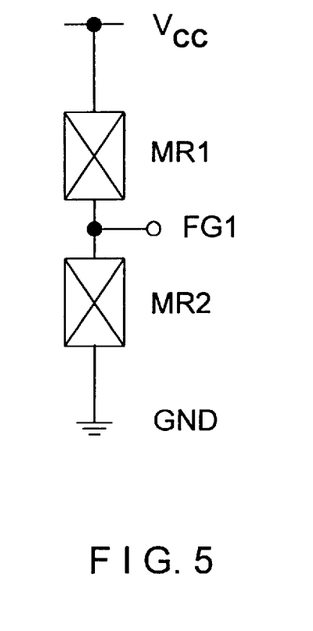
FIG. 5 shows an equivalent circuit that illustrates an example of a magnetic detector of a constant voltage type.

It is known that a magnetic detector which, for example, detects a position or rotation speed of a moving unit by arranging it in the vicinity of the moving unit is known. A constant voltage type and a constant current type are popular for these detectors. FIG. 5 illustrates an equivalent circuit for a magnetic detector of constant voltage type. In FIG. 5, two current paths MR1 and MR2, each positioned at different phases are series-connected to one another to configure a magnetic resistance element. A connection between the current path MR1 and current path MR2 is externally drawn and connected to an output terminal FG1. One end of the current path MR1 is connected to a power supply terminal Vcc, and one end of the current MR2 is connected to a grounding terminal GND. A magnetic detector of such a constant voltage type reads by the output terminal FG1 a mid-potential of the current paths MR1 and MR2 which are series-connected with each other and replaces changes in the magnetic signal with electric signals.

Figure 6:
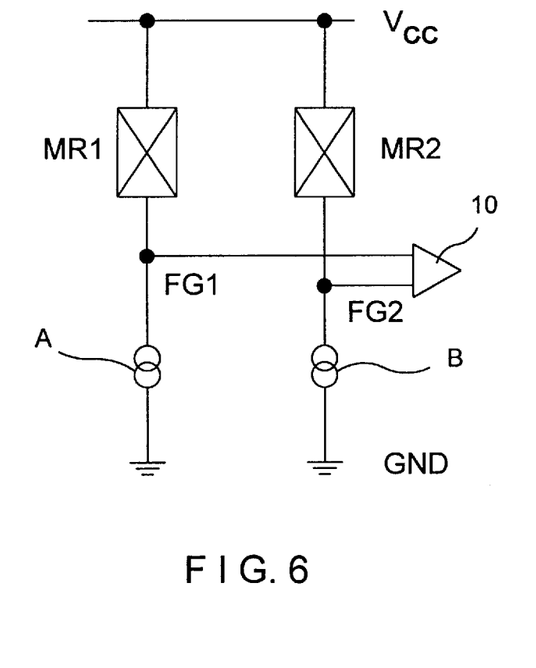
FIG. 6 shows an equivalent circuit that illustrates an example of a magnetic detector of a constant current type.

FIG. 6 illustrates an equivalent circuit for a magnetic detector of a constant current type. In FIG. 6, two current paths MR1 and MR2 which are arranged in positions with different phases from one another are series-connected with each other to configure a magnetic resistance element. A connection between the current paths MR1 and MR2 is externally drawn and connected to a power supply terminal Vcc. One end of the current path MR1 is connected to an output terminal FG1, and one end of the current path MR2 to the output terminal FG2. A current source A is connected to the output terminal FG1, a current source B to the output terminal FG2. The output terminal FG1 and output terminal FG2 are respectively connected to a differential input terminal of a differential amplifier circuit 10, by which the differential of the mid-potential of each of the current MR1 and MR2 is read to replace the magnetic signal changes with electric signals.

Figure 7:
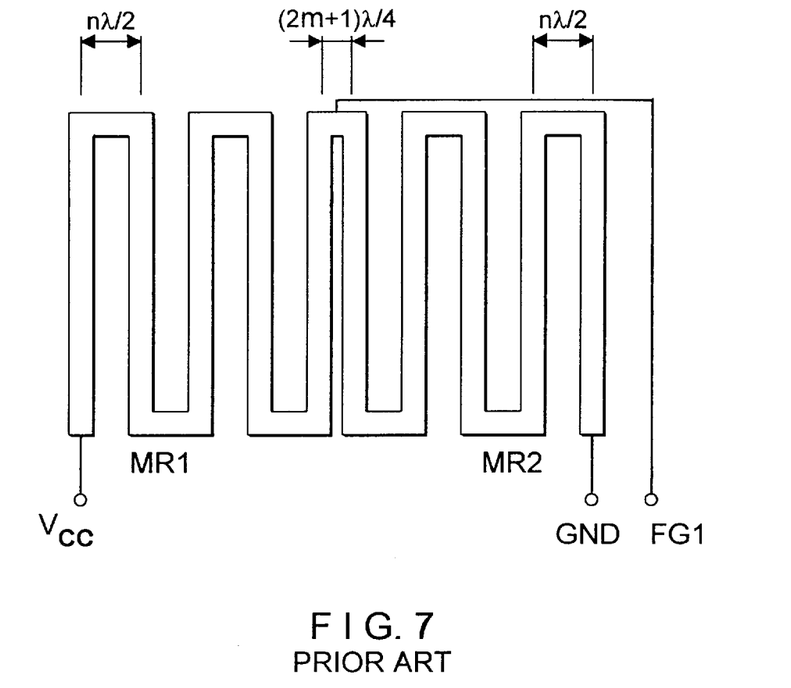
FIG. 7 shows a magnified plain view of a major section of a magnetic detector of a conventional constant voltage type.

Next, a magnetic detector of a constant voltage type is described in detail. FIG. 7 illustrates a wavy shaped magnetic resistance element formed between the power supply terminal Vcc and the grounding terminal GND. The magnetic resistance element is constituted of a first current path MR1 and a second current path MR2 which are series-connected; the first and second current paths MR1 and MR2 are made of a plurality of magnetic resistance strips. The first current path MR1 and the second current path MR2 are arranged so that they are symmetrical. A connection between the first current path MR1 and second current path MR2, that is, the mid-point of the magnetic resistance element, is externally drawn and connected to the output terminal FG1.

Figure 8:
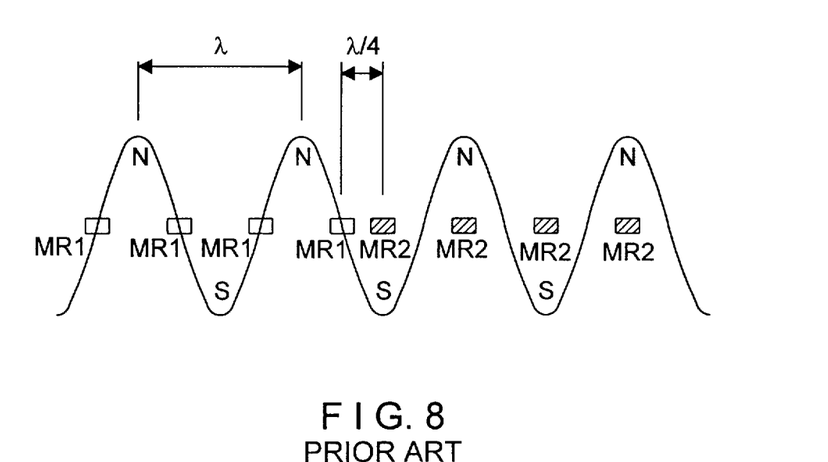
FIG. 8 shows a pattern diagram that illustrates a positional relationship between the signals on the magnetic recording medium side and the magnetic resistance strips in a conventional magnetic detector.

When a wavelength of the magnetic signal that is input via a magnetic recording medium mounted to the moving side is to be $\lambda$ as illustrated in FIG. 8, each of the magnetic resistance strips constituting the first current path MR1 is, in FIG. 7, spaced by $n\lambda/2$ (where n is an integer of 1 or larger). Each of the magnetic resistance strips constituting the second current path MR2 is also spaced by $n\lambda/2$ (where n is an integer of 1 or larger). The first current path MR1 and second current path MR2 are spaced by $(2m+1)\lambda/4$ (where m is an integer of 0 or larger).

Figure 9:
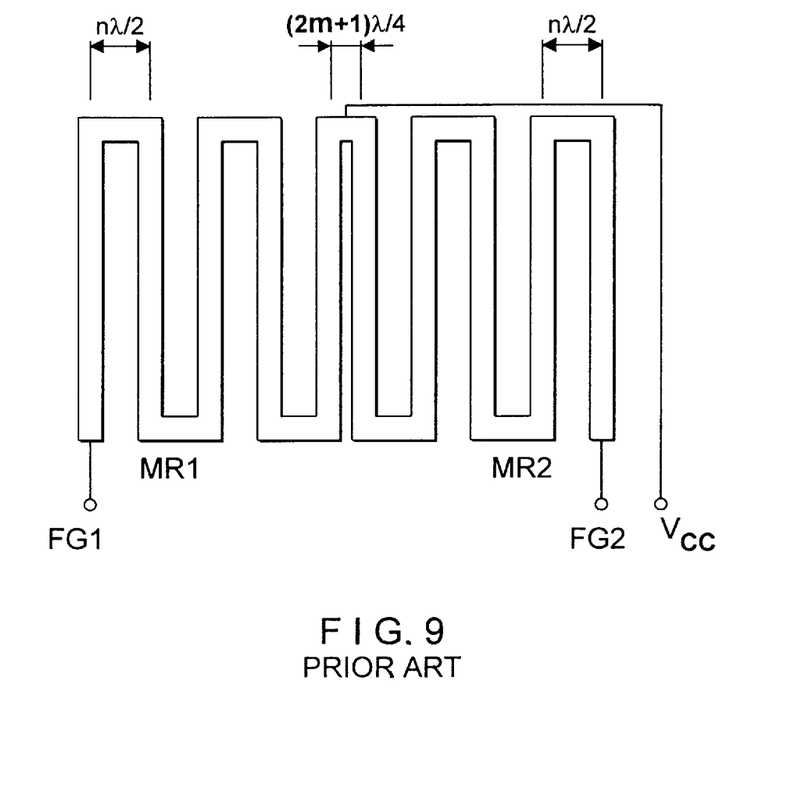
FIG. 9 shows a magnified plain view of a major section of a magnetic detector of a conventional constant current type.

In a magnetic detector of a constant current type, as illustrated in FIG. 9, a wavy shaped magnetic resistance element is formed between terminals FG1 and FG2 that are connected to current sources which are not illustrated. A current path of the magnetic resistance element is constituted in the same way as a constant voltage type including positioning. A connection between the first current path MR1 and second current path MR2, that is, a mid-point of the magnetic resistance element is externally drawn and connected to a power supply terminal Vcc. A differential amplifier circuit which is not illustrated is connected to the terminal FG1 and the terminal FG2 which are connected to differential input terminals of the differential amplifier circuit respectively, by which the differential of the mid potential can be obtained.

When a wavelength of the magnetic signal that is input via a magnetic recording medium mounted to the moving side is to be $\lambda$ as illustrated in FIG. 8, in FIG. 9 each of the magnetic resistance strips composing the first current path MR1, each of the magnetic resistance strips composing the second current path MR2, and the space between the first current path MR1 and second current path MR2, are spaced by the same intervals as those of the aforementioned constant voltage type.

The deviations in film thickness generated during fabrication, resolution generated during photolithography processing, and substrate orientation affects magnetic resistance strips to be fabricated and cause uneven thickness, width, and the like, of the magnetic resistance strips in any of the magnetic detectors mentioned above. In addition, when a magnetic element is fabricated without a magnetic field, a small anisotropy may occur at various fabrication locations. For the reasons above, each resistivity of the first magnetic resistance element group MR1 and the second magnetic resistance element group MR2 were not in accord but deviated from each other. In addition, as the magnetic properties of the first current path MR1 and the second current path MR2 deviates, the mid point of the output signal is displaced, making it difficult for the resolution to be as targeted. Moreover, when arranging the magnetic resistance element group MR1 and magnetic resistance element group MR2 symmetrically, a wider space was required to form a magnetic resistance element in a magnetic detector, thus making it difficult to be compact.

U.S. Pat. No. 5,047,716 discloses related art in addition to the above regarding the equivalent circuit for a magnetic detector of a constant voltage type and a constant current type. This technology as well has the same drawback as mentioned above.

OBJECT AND SUMMARY OF THE INVENTION

This invention aims to resolve such problems which the conventional technology has, to enable decreasing size, and also to provide a magnetic detector having a magnetic resistance element comprising current paths of equal magnetic properties and resistance.

In accordance with the invention, a magnetic detector comprises a magnetic recording medium in which a magnetic signal of wavelength $\lambda$ generated by two types of opposing magnetic poles which are repeated at constant intervals is recorded and a magnetic resistance element that is arranged opposite to the magnetic recording medium and changes its resistivity value according to the change in a magnetic field. The magnetic resistance element is comprised of first and second current paths constructed of a plurality of magnetic resistance strips. The first current path and the second current path are connected in series with each other. Each magnetic strip of the first current path is arranged parallel to that of the second current path at an interval of $\lambda/4$ to form a plurality of magnetic resistance strip sets. Centers of the magnetic strip sets are spaced by $3n\lambda/4$ from each other, where n is an integer of 1 or greater.

DESCRIPTION OF THE PREFERRED EMBODIMENTS

Figure 1:
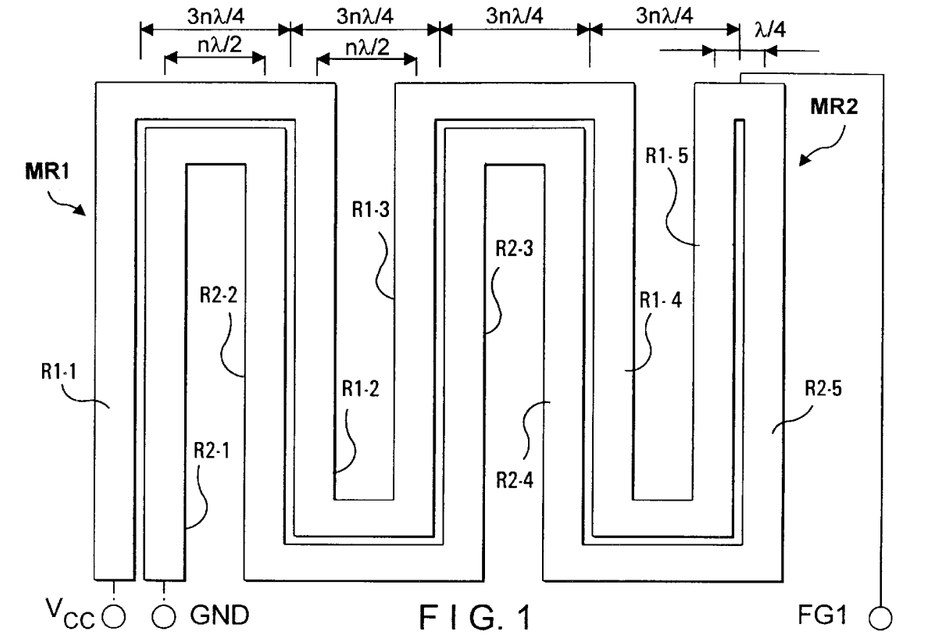
FIG. 1 shows a magnified plain view of a major section of a magnetic detector of an example of this invention.

Examples of a magnetic detector of this invention are described referring to the drawings. First of all, a magnetic detector of a constant voltage is described. In FIG. 1, a magnetic resistance element is configured with a current path MR1 and a current path MR2 connected in series. One end of the current path MR1 is connected to a power supply terminal Vcc; one end of the current path MR2 is and connected to a grounding terminal GND. In addition, the connection between the current path MR1 and the current path 2 is externally drawn is connected to an output terminal FG 1.

The current path MR1 is shaped in a wavy strip wherein magnetic resistance strips R1-1, R1-2, R1-3, R1-4, and R1-5 are arranged in parallel. In the current path MR1, The width of the magnetic strips R1-1~R1-5 is less than $\lambda/4$; the distance between the magnetic resistance strip R1-1 and the magnetic resistance strip R1-2 is $n\lambda$; the distance between the magnetic resistance strip R1-2 and the magnetic resistance strip R1-3 is $n\lambda/2$; the distance between the magnetic resistance strip R1-3 and the magnetic resistance strip R1-4 is $n\lambda$; the distance between the magnetic resistance strip R1-4 and the magnetic resistance strip R1-5 is $n\lambda/2$, where n is an integer of 1 or greater.

On the other hand, the current path MR2 is shaped in a wavy strip wherein the valley of the current path MR1 and the peak of the. current path MR2 are arranged as if they are engaged; the peak of the current path MR1 and the valley of the current path MR2 are also engaged. In other words, they are constantly adjacently engaged at a predetermined distance. The current path M2 is also configured so that magnetic resistance strips R2-1, R2-2, R2-3, R2-4, and R2-5 are arranged in parallel. In the current path MR2, the width of the magnetic strips R2-1~R2-5 is less than $\lambda/4$ as is in the current path MR1, where n is an integer of 1 or greater; the distance between the magnetic resistance strips R2-1 and R2-2 is $n\lambda/2$; the distance between the magnetic resistance strips R2-2 and R2-3 is $n\lambda$; the distance between the magnetic resistance strips R2-3 and R2-4 is $n\lambda/2$; the distance between the magnetic resistance strips R2-4 and R2-5 is $n\lambda$. To note that the distance between the magnetic strips in the current path MR1 and in the current path MR2 is $n\lambda$ and $n\lambda/2$ alternately: either the order of $n\lambda$, $n\lambda/2$, $n\lambda$, $n\lambda/2$ or $n\lambda/2$, $n\lambda$, $n\lambda/2$, $n\lambda$ is acceptable.

Between the magnetic resistance strips R1-1 and R1-2 in the current path MR1, the magnetic resistance strips R2-1, R2-2 in the current path MR2 are arranged in parallel to the magnetic resistance strips R1-1 and R1-2. In addition, between the magnetic resistance strips R1-3 and R1-4 in the current path MR1, the magnetic resistance strips R2-3, R2-4 in the current path MR2 are arranged in parallel to the magnetic resistance strips R1-3 and R1-4. Moreover, in the position adjacent to the magnetic resistance strip R1-5 in the current path MR1, the magnetic resistance strip R2-5 is arranged in parallel to the magnetic strip R1-5.

A set of magnetic resistance strips is configured by spacing the center of the magnetic resistance strip R1-1 and that of the magnetic strip R2-1 in parallel by $\lambda/4$. In the same manner, the magnetic resistance strip R1-2 and the magnetic resistance strip R2-2, the magnetic resistance strip R1-3 and the magnetic resistance strip R2-3, the magnetic resistance strip R1-4 and the magnetic resistance strip R2-4, the magnetic resistance strip R1-5 and the magnetic resistance strip R2-5 are spaced in parallel by $\lambda/4$ to form 5 sets of magnetic resistance strips. The center of each set of magnetic resistance strips and that of the adjacent set of magnetic resistance strips are spaced by $3n\lambda/4$ (where n is an integer of 1 or greater).

In such a magnetic resistance element of the constant voltage type with the above configuration, each magnetic resistance strip in the current path MR1 such as R1-1, R1-2, R1-3, R1-4, R1-5 and the magnetic resistance strip in the current path MR2 such as R2-1, R2-2, R2-3, R2-4, R2-5 are spaced in parallel by $\lambda/4$ to form a plurality of sets of magnetic resistance strips, and at the same time, the center of each magnetic resistance strip set is spaced by $3n\lambda/4$ (where n is an integer of 1 or greater). Therefore, the valley of the current path MR1 looks as if it is engaged with the peak of the current path MR2; the peak of the current path MR1 looks as if it is engaged with the valley of the current path MR2; the current paths MR1 and MR2 are arranged to be adjacent to each other and are always spaced by the same distance. For this reason, deviation in film thickness generated during fabrication, resolution generated during photolithography processing, and substrate orientation, and the like, affects equally the performances of current path MR1 and the current path MR2 which construct a magnetic resistance element. Therefore, the resistance or magnetic property for the current path MR1 and the current path MR2 deviates with the same magnitude providing the uniformity needed for the mid-potential to be as targeted. Furthermore, since the occupancy area for a pattern is smaller than that of the conventional technology, the chip can be made smaller, thus providing shrinkage in size.

Figure 2:
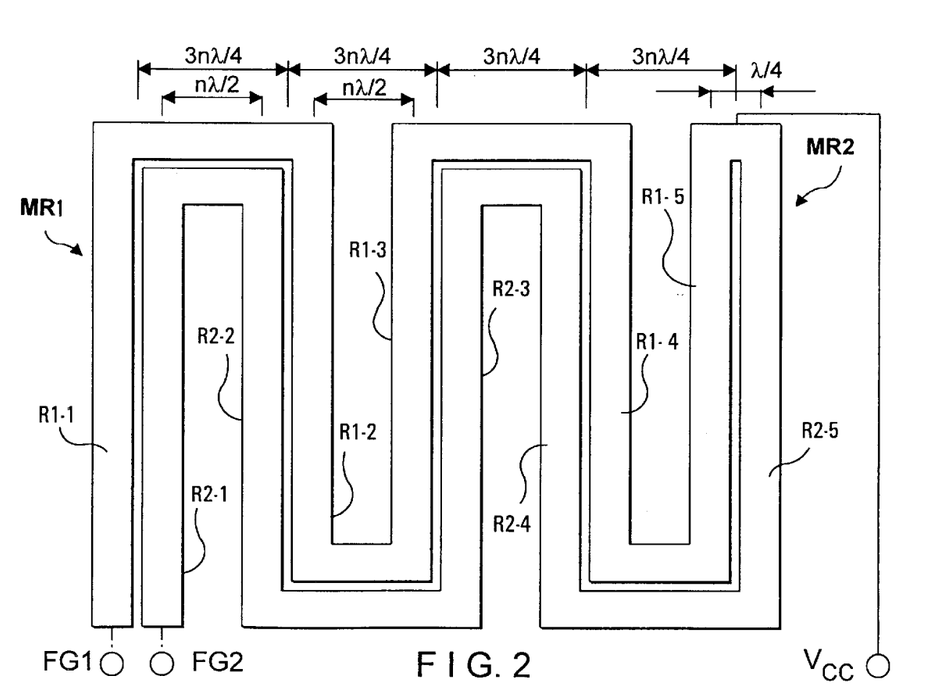
FIG. 2 shows a magnified plain view of a major section of a magnetic detector of another example of this invention.

The magnetic resistance element having the above configuration is not limited to the constant voltage type, and can be applied to a magnetic detector of a constant current type as illustrated in FIG. 2. In the magnetic detector illustrated in FIG. 2, the connection between the current path MR1 and the current path MR2 is externally drawn and is connected to a power supply terminal Vcc. In addition, one end of the current path MR1, that is, one end of the magnetic resistance strip R1-1 is connected to the output terminal FG 1 while a current source, which is not illustrated, is connected to the output terminal FG 1. Moreover, one end of the current path MR2, that is, one end of the magnetic resistance strip R2-1 is connected to the output terminal FG 2 while a current source, which is not illustrated, is connected to the output terminal FG 2. Furthermore, the output terminals FG 1 and FG 2 are connected to a differential amplifier circuit, which is not illustrated, by which the differential of the mid-potential can be obtained.

Figure 3:
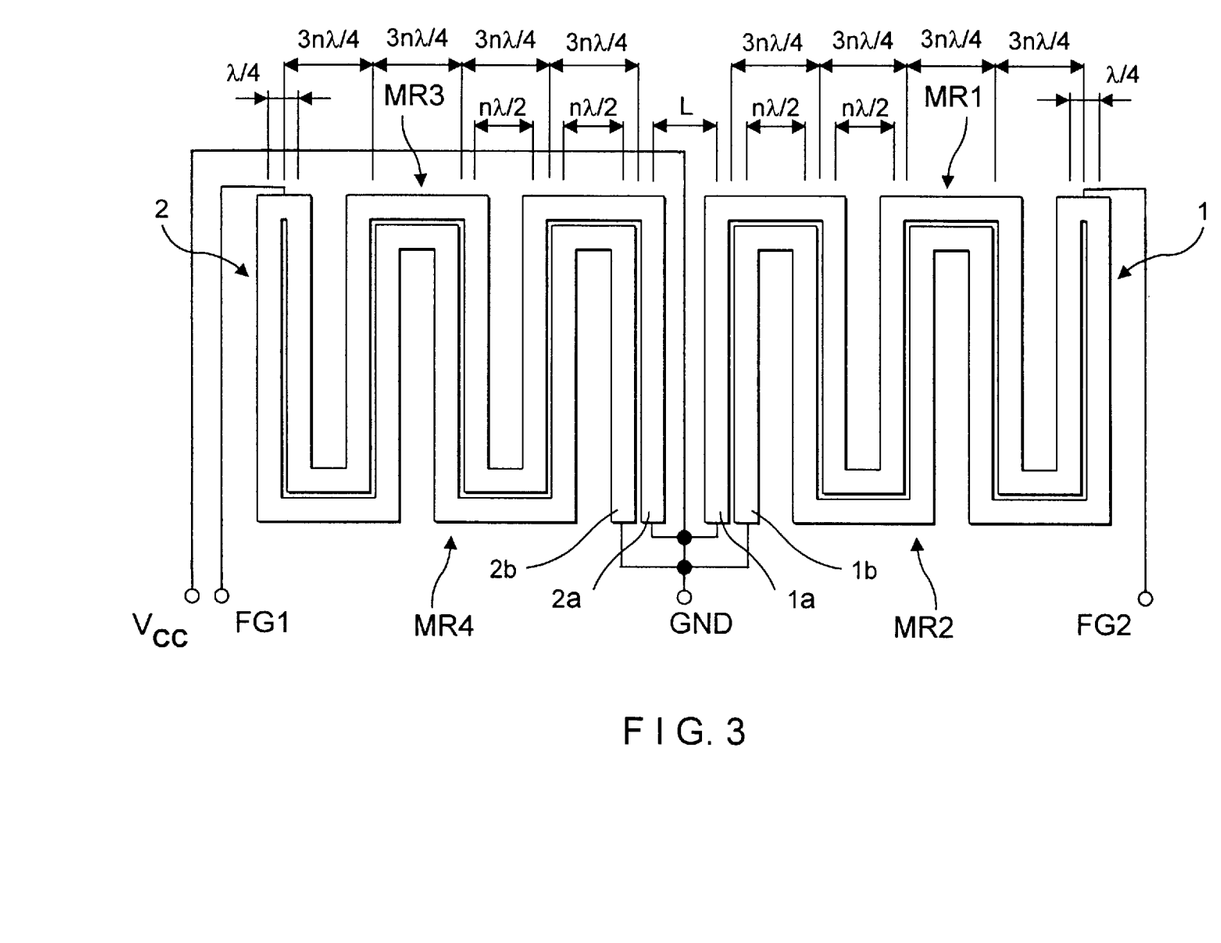
FIG. 3 shows a magnified plain view of a major section of the magnetic detector of another example of this invention.

The magnetic detector can be configured with two sets of magnetic resistance elements comprising the two current paths MR1 and MR2 mentioned above. FIG. 3 illustrates a magnetic detector of a constant voltage type using two sets of magnetic resistance elements. In FIG. 3, the magnetic resistance element comprises a magnetic resistance element 1 on right and a magnetic resistance element 2 on left. The magnetic resistance element 1 is configured with current paths MR1 and MR2 comprised of a plurality of magnetic resistance strips as described in the previous example. The current paths MR1, MR2 are shaped in wavy strips wherein the wavy strip peak of the current path MR1 and the wavy strip valley of the current path MR2 are arranged as if they are engaged. In other words, they are constantly adjacently engaged at a predetermined distance. The wavy strip valley of the current path MR1 and the wavy strip peak of the current path MR2 are arranged also as if they are engaged. In other words, they are constantly adjacently engaged at a predetermined distance. Each magnetic resistance strip of the current path MR1 and each magnetic resistance strip of the current path MR2 are spaced in parallel by $\lambda/4$ to compose a plurality of magnetic resistance strip sets; the center of each of the magnetic resistance strip sets is spaced by $3n\lambda/4$ from the center of another set (where n is an integer of 1 or greater).

In addition, the magnetic resistance element 2 comprises current paths MR3 and MR4 connected in series with one another, with the same configuration as the magnetic resistance element 1. The current paths MR3 and MR4 are shaped in wavy strips wherein the wavy strip peak of the current path MR3 and the wavy strip valley of the current path MR4 look as if they look as if they are engaged. In other words, they are constantly adjacently engaged at a predetermined distance. The wavy strip valley of the current path MR3 and the wavy strip peak of the current path MR4 are arranged also as if they are engaged. In other words, they are constantly adjacently engaged at a predetermined distance. Each magnetic resistance strip of the current path MR3 and each magnetic resistance strip of the current path MR4 are spaced in parallel by $\lambda/4$; centers of magnetic resistance strip sets are spaced by $3n\lambda/4$ (where n is an integer of 1 or greater).

The magnetic resistance elements 1 and 2 as above are symmetrically positioned on the surface of magnetic sensor in a magnetic detector. The space L between the two magnetic resistance elements 1 and 2, that is, the space between the center of the magnetic resistance strip 1a of the magnetic resistance element 1, closest to the magnetic resistance element 2 and the center of the magnetic resistance strip 2a of the magnetic resistance element 2, closest to the magnetic resistance element 1, where n is an integer of 1 or larger, is set to be $(2n+1)\lambda/8$ for a magnetic detector of the type which detects rotational direction or movement direction using 90° phase contrast; L is set to be $(2n+1)\lambda/4$ for a magnetic detector of the type which doubles output using 180° phase contrast.

The magnetic resistance strip 1a which is one end of the magnetic resistance element 1 and the magnetic resistance strip 2a which is one end of the magnetic resistance element 2 are connected. This connection is externally drawn and is connected to the power supply terminal Vcc. In addition, the magnetic resistance strip 1b which is the other end of the magnetic resistance element 1 and the magnetic resistance strip 2b which is the other end of the magnetic resistance element 2 are connected. This connection is connected to a grounding terminal GND. Moreover, the mid-point between the current paths MR1 and MR2 of the magnetic resistance element 1 is externally drawn and is connected to an output terminal FG 2, and the mid-point between the current paths MR3 and MR4 of the magnetic resistance element 2 is externally drawn and is connected to an output terminal FG 1 respectively.

As described above, the magnetic detector using two sets of magnetic resistance elements like the magnetic detector using one set of magnetic resistance elements is configured in that each of the magnetic resistance elements 1 and 2 is comprised of a first current path (MR1, MR3) and a second current path (MR2, MR4); each magnetic resistance strip of the first current path (MR1, MR3) and each magnetic resistance strip of the second current path MR2 or MR4 are spaced in parallel by $\lambda/4$ to form a plurality of magnetic resistance strip sets; in addition, because the center of each magnetic resistance strip set is spaced by $3n\lambda/4$ (where n an integer of 1 or greater), the first current path and the second current path, which construct each magnetic resistance element, are so adjacent as to be engaged. In other words, they are constantly adjacently engaged at a predetermined distance. For this reason, the deviation in film thickness generated during fabrication, resolution generated during photolithography processing, and substrate orientation, and the like, which affects magnetic resistance strips, affects equally the performances of the current path MR1 and the current path MR2 which construct a magnetic resistance element. Therefore, the aforementioned effects are mutually nullified between each current path, resulting in providing the uniformity needed for the mid-potential to be as targeted.

Figure 4:
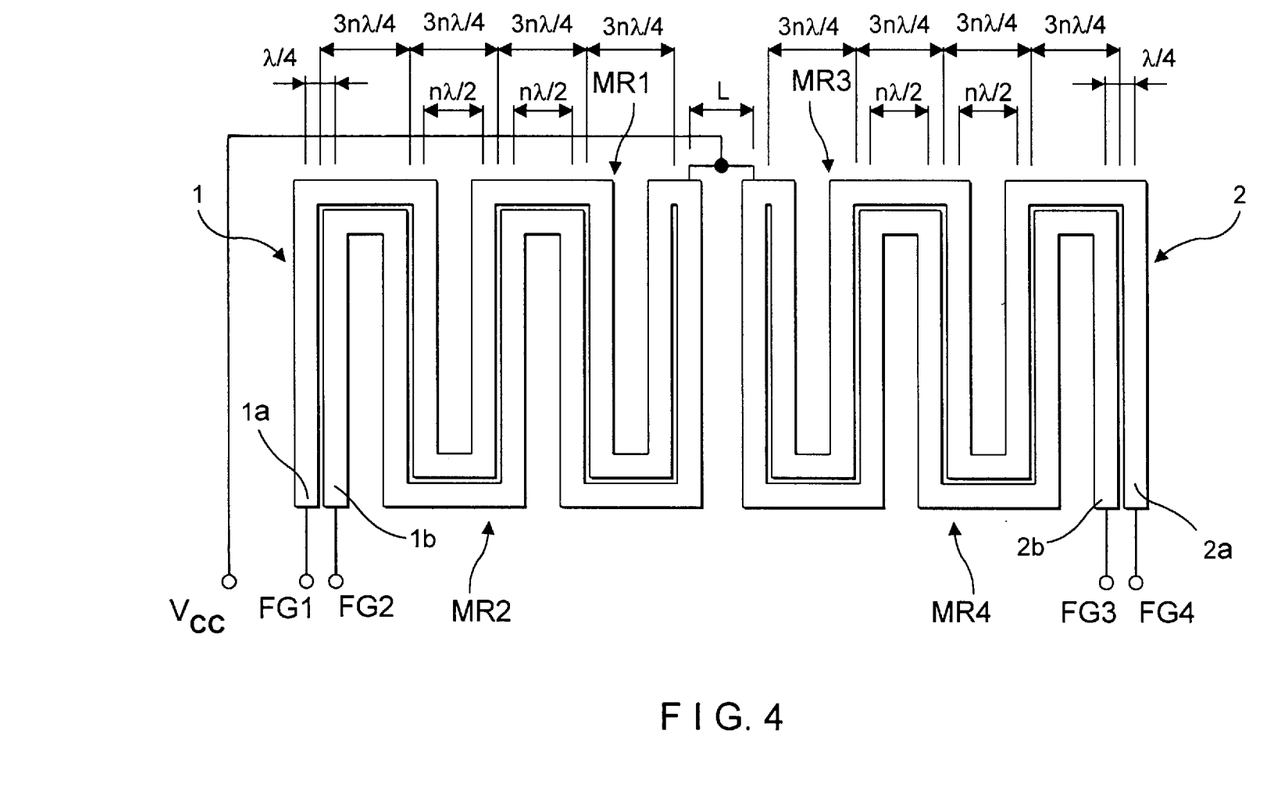
FIG. 4 shows a magnified plain view of a major section of a magnetic detector of another example of this invention.

As illustrated in FIG. 4, further, the left and right positioning of magnetic resistance elements 1,2 can be switched to configure a magnetic detector of the constant current type. Because magnetic resistance elements of the same configuration are used, the same effect as the examples mentioned above can be obtained. In a magnetic detector illustrated in FIG. 4, the space L between the two magnetic resistance elements 1 and 2, that is, the space between the center of the magnetic resistance strip, closest to the magnetic resistance element 2, of the magnetic resistance element 1 and the center of the magnetic resistance strip, closest to the magnetic resistance element 1, of the magnetic resistance element 2, where n is an integer of 1 or larger, is set to be $(2n+1)\lambda/8$ for a magnetic detector of the type which detects rotational direction or movement direction using 90° phase contrast; L is set to be $(2n+1)\lambda/4$ for a magnetic detector of the type which doubles output using 180° phase contrast. The connection between the current paths MR1, MR2, and the current paths MR3, MR4 is externally drawn and is connected to the power supply terminal Vcc. In addition, the magnetic resistance strip 1a which is one end of the magnetic resistance element 1 is connected to the output terminal FG 1; the magnetic resistance strip 1b which is the other end of the magnetic resistance element 1 is connected to the output terminal FG 2; the magnetic resistance strip 2a which is one end of the magnetic resistance element 2 is connected to the output terminal FG 4; the magnetic resistance strip 2b which is the other end of the magnetic resistance element 2 is connected to the output terminal FG 3. Moreover, the output terminals FG 1 and FG 2 of the magnetic resistance element 1 are respectively connected to a separate power sources, which are not illustrated. The output terminals FG 1 and FG2 are connected to a differential input terminal of the differential amplifier circuit, by which the differential output of the mid-potential can be obtained. Furthermore, the output terminals FG3 and FG4 of the magnetic resistance element 2 are also connected to separate power sources, which are not illustrated. The output terminals FG3 and FG4 are respectively connected to the differential input terminal, which is not illustrated, with which the differential output of the mid-potential is obtained.

In this invention, each of the magnetic resistance strips of the first current path and those of the second current path are spaced in parallel by $\lambda/4$ to form a plurality of magnetic resistance strip sets. In addition, the centers of each set of magnetic resistance strips are spaced by $3n\lambda/4$ (where n is an integer of 1 or greater). In this way, a set of valleys and peaks of a current path consisting of a wavy strip and another set of peaks and valleys of another current path consisting of a wavy strip are constantly adjacently engaged at a predetermined distance. For this reason, the deviation in film thickness generated during fabrication, resolution generated during photolithography processing, and substrate orientation, and the like, which affects a magnetic resistance strip, affects the performances of the first and second current paths equally. As a result, resistivity or magnetic property changes with the same magnitude, thus nullifying the deviation between each current path. This technology can also reduce the occupancy area for strips and can provide smaller chips, contributing to be shrinkage in size of chips.

While the foregoing description and drawings represent the preferred embodiments of the present invention, it will be obvious to those skilled in the art that various changes and modifications may be made therein without departing from the true spirit and scope of the present invention.

What is claimed is:

1. A magnetic detector, comprising:

a magnetic recording medium in which a magnetic signal of wavelength $\lambda$ generated by two types of opposing magnetic poles which are repeated at constant intervals is recorded;

first and second magnetic resistance elements that are arranged opposite to said magnetic recording medium and change their resistivity value according to the change in a magnetic field , each of said magnetic resistance elements being comprised of first and second current paths constructed of a plurality of magnetic resistance strips , said fist current path and said second current path of the respective magnetic resistance elements being connected in series with each other , each magnetic strip of said first current path being arranged parallel to that of said second current path at an interval of $\lambda/4$ to form a plurality of magnetic resistance strip sets , and centers of said magnetic resistance strip sets being spaced by $3n\lambda/4$ from each other, where n is an integer of 1 or greater, wherein each of said magnetic elements are connected in parallel between a power supply terminal and a grounding terminal, and are also arranged so that the magnetic resistance strips of said magnetic resistance elements are arranged parallel to each other, while said magnetic resistance elements are arranged in symmetry with each other with respect to a line which is parallel to the magnetic resistance strips.

2. The magnetic detector according to claim 2, wherein said two linearly symmetrical magnetic resistance elements are arranged so that magnetic strips which are closest to each other on sides of the line of symmetry are spaced by $(2n+1)\lambda/9$.

3. The magnetic detector according to claim 1, wherein said two linearly symmetrical magnetic resistance elements are arranged so that magnetic strips which are closest to each other on sides of a line of symmetry are spaced by $(2n+1)\lambda/4$.

4. The magnetic detector according to claim 1, wherein magnetic resistance strips are equally formed with the width less than $\lambda/4$, and arranged so that the distance between adjacent magnetic resistance strips in a same current path is alternated by either $n\lambda/2, n\lambda, n\lambda/2, n\lambda$, or $n\lambda, n\lambda/2, n\lambda, n\lambda2$, where n is an integer of 1 or greater.

5. A magnetic detector comprising:

a magnetic recording medium in which a magnetic signal of wavelength $\lambda$ generated by two types of opposing magnetic poles which are repeated at constant intervals is recorded;

a magnetic resistance element for use as a current type detector that is arranged opposite to said magnetic recording medium and changes its resistivity according to the change in a magnetic field;

said magnetic resistance element being comprised of first and second current paths constructed of a plurality of magnetic resistance strips;

said first current path and said second current path being connected in parallel to one another and also connected to a power supply respectively;

magnetic resistance strips of said first current path being spaced in parallel to those of said second current path by $\lambda/4$ to form a plurality of magnetic resistance strip sets; and centers of said magnetic resistance strip sets being spaced by $3n\lambda/4$, where n is an integer of 1 or greater.

6. A magnetic detector, comprising:

a magnetic recording medium in which a magnetic signal of wavelength $\lambda$ generated by two types of opposing magnetic poles which are repeated at constant intervals is recorded:

first and second magnetic resistance elements that are arranged opposite to said magnetic recording medium and change their resistivity according to the change in a magnetic field , each of said magnetic resistance elements being comprised of first and second current paths constructed of a plurality of magnetic resistance strips;

said first current path and said second current path of the respective magnetic resistance element being connected in parallel to one another and also connected to a power supply respectively ;

magnetic resistance strips of said first current path being spaced in parallel to those of said second current path by $\lambda/4$ to form a plurality of magnetic resistance strip sets , and centers of said magnetic resistance strip sets being spaced by $3n\lambda/4$, where n is an integer of 1 or greater wherein

[two] each of said magnetic resistance elements are connected in parallel to one another, and are arranged so that the magnetic resistance strips of said magnetic resistance elements are arranged in parallel to one another, while said magnetic resistance elements are arranged in symmetry with each other with respect to a line which is parallel to a magnetic resistance strip.

7. The magnetic detector according to claim 6, wherein said two linearly symmetrical magnetic resistance elements are arranged so that magnetic strips which are closest to each other on sides of the line of symmetry are spaced by $(2n+1)\lambda/8$.

8. The magnetic detector according to claim 6, wherein said two linearly symmetrical magnetic resistance elements are arranged so that magnetic strips which are closest to each other on sides of a line of symmetry are spaced by $(2n+1)\lambda/4$.

9. The magnetic detector according to claim 5, wherein magnetic resistance strips are equally formed with the width less than $\lambda/4$, and arranged so that the distance between adjacent magnetic resistance strips in a same current path is alternated by either n k/2, n$\lambda$, n$\lambda$/2, n$\lambda$, or n$\lambda$, n$\lambda$/2, n$\lambda$, n$\lambda$2, where n is an integer of 1 or greater.

10. The magnetic detector according to claim 5, wherein each of said first and second current paths is coupled to a respective current source.

* * * * *